United States Patent
Fukushima et al.

(10) Patent No.: US 7,276,709 B2
(45) Date of Patent: Oct. 2, 2007

(54) SYSTEM AND METHOD FOR ELECTRON-BEAM LITHOGRAPHY

(75) Inventors: Yoshimasa Fukushima, Hitachinaka (JP); Hiroshi Tsuji, Tokyo (JP); Sayaka Tanimoto, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 335 days.

(21) Appl. No.: 11/109,861

(22) Filed: Apr. 20, 2005

(65) Prior Publication Data

US 2005/0230637 A1 Oct. 20, 2005

(30) Foreign Application Priority Data

Apr. 20, 2004 (JP) ............................. 2004-124037

(51) Int. Cl.
*H01J 37/20* (2006.01)
(52) U.S. Cl. ................................. 250/443.1; 250/492.2
(58) Field of Classification Search ............. 250/492.2, 250/443.1
See application file for complete search history.

(56) References Cited

U.S. PATENT DOCUMENTS 4,789,781 A * 12/1988 Kitagawa et al. ........ 250/443.1
5,898,177 A * 4/1999 Hidaka et al. ........... 250/443.1
6,495,838 B1* 12/2002 Yaguchi et al. .......... 250/443.1
2006/0033035 A1* 2/2006 Itzkovitch et al. ... 250/396 ML

FOREIGN PATENT DOCUMENTS

| JP | 10-241621 | 9/1998 |
|---|---|---|
| JP | 2000-182759 | 6/2000 |
| JP | 2002-353116 | 12/2002 |

* cited by examiner

Primary Examiner—Jack I. Berman
(74) Attorney, Agent, or Firm—McDermott Will & Emery LLP

(57) ABSTRACT

To achieve high-resolution lithography, the temperature of a sample is controlled with heater wires during electron-beam lithography, the adverse effect of a magnetic field induced by the heater current is suppressed. Namely, heater wires are used to control the temperature of a sample so that the temperature will be maintained constant. In order to minimize the adverse effect of a magnetic field during the passage of currents through the heater wires, two heater wires are layered with the arrangement of the upper and lower sides, currents are fed to flow through the heater wires in mutually opposite directions, and the ratio of the current flowing through the upper heater wire to the one flowing through the lower heater wire is slightly changed from zero.

8 Claims, 7 Drawing Sheets

US 7,276,709 B2

SYSTEM AND METHOD FOR ELECTRON-BEAM LITHOGRAPHY

CLAIM OF PRIORITY

The present application claims priority from Japanese application serial no. 2004-124037, filed on Apr. 20, 2004, the content of which is hereby incorporated by reference into this application.

FIELD OF THE INVENTION

The present invention relates to a system and a method for electron-beam lithography, more particularly to the system and the method for performing high-resolution lithography (drawing) by suppressing a thermal distortion to a sample or a structural member of a stage for the sample.

BACKGROUND ART

In recent years, for example in semiconductor devices fabricated by electron-beam lithography, lithography patterns with high-resolution have been required high positional precision along with improvement in a high degree of integration of the semiconductor devices. Electron-beam lithography system is a system in which an electron beam is focused with an electron lens and deflected with a deflector while moving the sample, to draw high-resolution patterns on a sample with high positional precision. The positional precision is required in nanometers.

The coefficient of linear expansion of a silicon is $4 \times 10^{-6}[1/K]$. Therefore, the sample whose diameter is 300 mm expands 1.2 nm by an increase of $1/1000°$ C. in the temperature of the sample. Likewise, since the coefficient of linear expansion of a ceramic is $3 \times 10^{-6}[1/K]$, the ceramic structural member expands 0.9 nm by an increase of $1/1000°$ C. in the temperature of the ceramic. Consequently, in order to suppress an error (the thermal distortion) dependent on an ambient temperature to 1 nm, the sample and stage structural must be kept temperature-stable despite a thermal variation change in temperature of $1/1000°$ C.

Heat dissipated during lithography includes heat dissipated from an electrostatic chuck, rolling frictional heat dissipated from a stage guide, and heat dissipated from a motor. However, such heat is hardly released in a sample chamber because the chamber is held vacuum. According to a conventional technology, a coolant is circulated around a stage to keep the temperature of a sample constant. However, since a long time constant is required until heat is conveyed to a structural member after adjusting the temperature of the coolant, the temperature of a top table at the stage or the temperature of the sample deviates by a few hundredth of a degree C.

Japanese Patent Laid-Open No. 2002-353116 (Patent Document 1) has disclosed a technology of placing heater wires on a stage and compensating a temperature of the sample by the passage of electric current through a heater wire during a period of time where lithography is not performed.

In addition, the above-Document 1 has described that a magnetic field, which is induced by the passage of electric current through the heater wire, have an adverse effect on electron-beam lithography (drawing) on a sample, and described how to prevent such an effect. Particularly in the Document 1, a heater wire having the same current-carrying capacities is disposed with turns in parallel, and current is fed through the turned heater wire potions in mutually opposite directions, whereby the adverse effect of the magnetic field is minimized.

SUMMARY OF THE INVENTION

For high-resolution lithography, the temperature of a sample must be controlled upon a variance $1/1000°$ C. or less. An object of the present invention is to suppress the adverse effect of a magnetic field while stabilizing the temperature of a sample all the time by controlling the temperatures of heater wires during not only a time interval during which lithography is not performed but also a time interval during which lithography is performed.

The present invention comprises a pair of heater wires incorporated in a sample holding stage with an arrangement of the upper and lower sides; a temperature sensor for sensing a temperature of the sample or stage; and a temperature controller for controlling the passage of current through the heater wires according to a value sensed by the temperature sensor. The directions of respective currents flowing through the upper heater wire and the lower heater wire are opposite to each other.

In addition, the present invention is characterized in that, on the condition that a pair of heater wires is incorporated in a sample holding stage with an arrangement of the upper and lower sides,
  flowing respective currents through the upper heater wire and the lower heater wire in mutually opposite directions; and
  controlling the currents flowing through the heater wires with a temperature controller so that a value sensed with the temperature sensor for sensing the temperature of the sample or stage is maintained in a designated temperature.

According to the present invention, the temperature of a sample can be stabilized and the adverse effect of a magnetic field can be minimized.

DETAILED DESCRIPTION OF THE PREFERRED EMBODIMENTS

When respective currents flow through the heater wires, a magnetic field is induced around the heater wires. The magnetic field adversely affects the trajectory of an electron beam and degrades positional precision of the electron beam.

The adverse effect of the magnetic field and the major portion of the present invention will be described in conjunction with FIG. 3 and FIG. 4.

Figure 3:
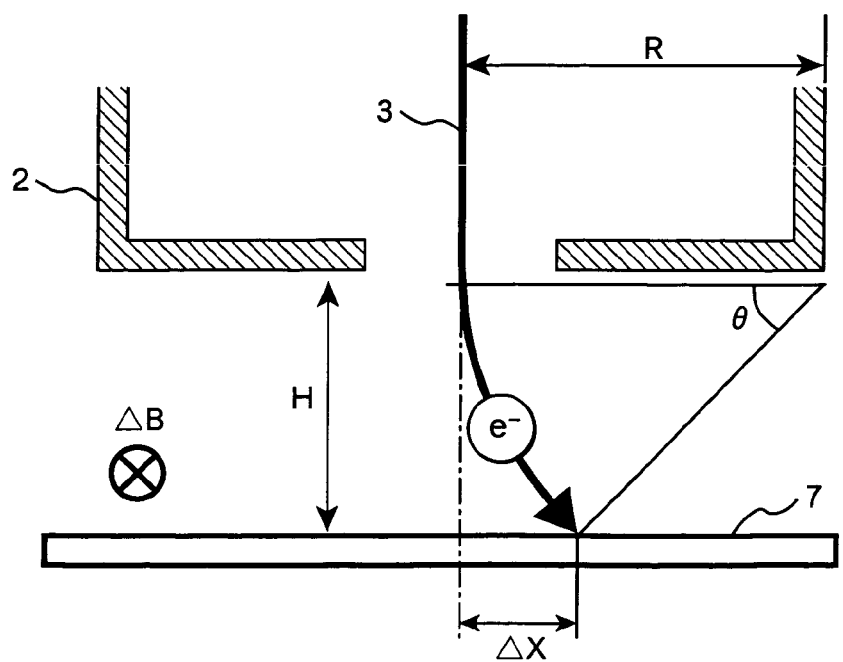
FIG. 3 shows a side view of a trajectory traced by electrons in the vicinity of the sample in the electron-beam lithography system shown in FIG. 1.

As shown in FIG. 3, a homogeneous magnetic field present in a space between an electro-optical column 2 and a sample 7 changes the spot of an irradiated electron beam 3. Assume that a distance from the bottom of the electro-optical column 2 to the sample 7 is Z m, and a variation of each of magnetic field strengths representing the magnetic field in the space is ΔB. Electrons having passed through the electro-optical column 2 are affected by the magnetic field and moved along a trajectory determined with the Bohr radius R, and finally reach a point of ΔX m from a target position.

As long as an angle θ is small enough, the following relationship is established:

$$\Delta X = Z^2/(2R) \quad \text{(formula 1)}$$

The formula 1 provides a geometric approximation of the relationship between the Bohr radius and the amount of a deviation of an electron beam.

The following formula 2 is an expression providing the Bohr radius:

$$R = mv/(e\Delta B) \quad \text{(formula 2)}$$

Here, m: a mass of an electron; $m = 9.1 \times 10^{-31}$ [kg],
e: an electric charge; $e = 1.6 \times 10^{-19}$ [C], and
v: a velocity of an electric charge When the formula 2 providing the Bohr radius is assigned to the formula 1, formula 3 presented below is drawn out.

The formula 3 is a relational expression between the amount of a variation of a magnetic field strength and the amount of a deviation of an electron beam spot.

$$(\Delta X/\Delta B) = eZ^2/(2mv) \quad \text{(formula 3)}$$

On the other hand, the energy of an electron is expressed as follows:

$$E = mv^2/2 \quad \text{(formula 4)}$$

The formula 4 provides the energy of an electron.

When the formula 3 and 4 are combined in order to delete v, the following formula is drawn out:

$$\frac{\Delta X}{\Delta B} = \frac{eZ^2}{2\sqrt{2Em}} \quad \text{(formula 5)}$$

The formula 5 is a relational expression between the amount of variation of a magnetic field strength and the amount of deviation of an electron beam spot.

If the amount of deviation of an electron beam spot, that is, $\Delta X = \pm 1$ [nm] is permitted under the conditions that the distance Z equals 25 mm and the voltage is 50 keV, the amount of variation of a magnetic field strength, that is, ΔB comes to ±2.5 nT.

When currents are fed to the heater wires, a magnetic field is induced around the heater wires. The magnetic field adversely affects the trajectory of an electron beam and degrades positional precision thereof.

A magnetic field strength induced with the passage of current through a linear portion of the heater wires is expressed by formula 6 presented below.

The formula 6 expresses a magnetic field strength induced when a current flows through a linear conductor.

$$H = i/(2 \cdot \pi \cdot a) \quad \text{(formula 6)}$$

Here, i: a current flowing through a conductor,
a: a distance from the conductor,
H: a magnetic field strength at a position the distance a from the conductor.

The smaller the current is, the smaller the magnetic field strength is. The longer the distance from the conductor is, the smaller the magnetic field strength is.

A magnetic field strength induced with the passage of current flow through an arc-shaped portion of a heater wire is expressed by formula 7.

The formula 7 expresses a magnetic field strength induced with a current flowing through a circular-shaped conductor.

$$H = i/(2 \cdot a) \quad \text{(formula 7)}$$

Here, i = a current flowing through a conductor,
a = a radius of curvature, and
H = a magnetic field strength at a center position.

The smaller the radius of curvature is, the larger an induced magnetic field strength is.

The relationship between a magnetic flux density B and a magnetic field strength H which are used to describe a magnetic field is expressed by formula 8.

The formula 8 expresses the relationship between a magnetic field strength and a magnetic flux density.

$$B = \mu o \cdot H \quad \text{(formula 8)}$$

Here, μo: magnetic permeability in a vacuum.

Figure 4A:
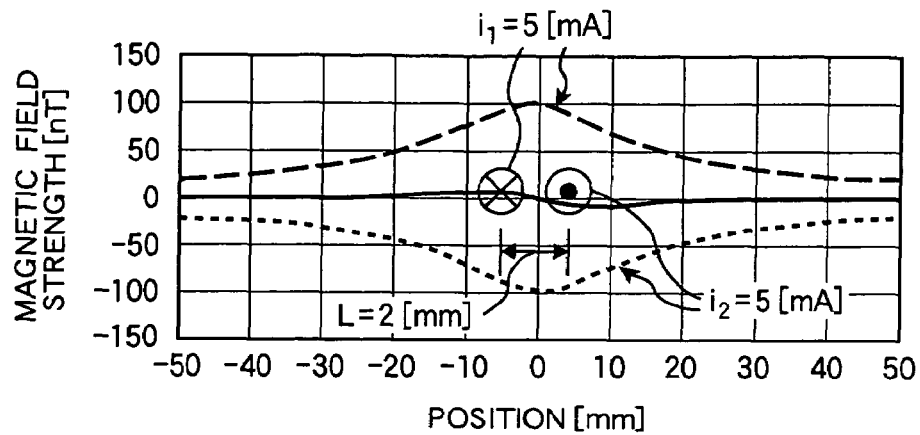
FIG. 4 is a graph showing a relationship of positions on the sample and magnetic field strengths.

FIG. 4(a) is a graph indicating magnetic field strengths induced at a position with a distance h (=10 mm) in a vertical direction from a coil (heater wires), under the condition that two conductors of the coil are arranged at a location with a distance of L=2 mm from each other in a horizontal direction, and currents of $i_1$ (=5 mA) and $i_2$ (=5 mA) flow through the respective conductors in mutually opposite directions.

A long-broken line indicates a magnetic field strength induced by the conductor located at a position represented by X=−1 mm, while a short-broken line indicates a magnetic field strength induced by the conductor located at a position represented by X=+1 mm. Directions indicated in the graph are the directions of the currents. The magnetic fields induced by the two conductors are cancelled out, and the resultant magnetic field varies as indicated with a solid line. The variation ΔB of the magnetic field strength comes to 14 nTpp. When the conductors, that is, the heater wires are lined side by side, the variation of the magnetic field strength varies vertically with respect to a reference line associated with a zero level. In case of FIG. 4A, a current receding from a viewer of the drawing make the variation of upward magnetic strength, and a current heading toward the viewer make the variation of downward magnetic strength. As a result, the total variations are increased.

Figure 4B:
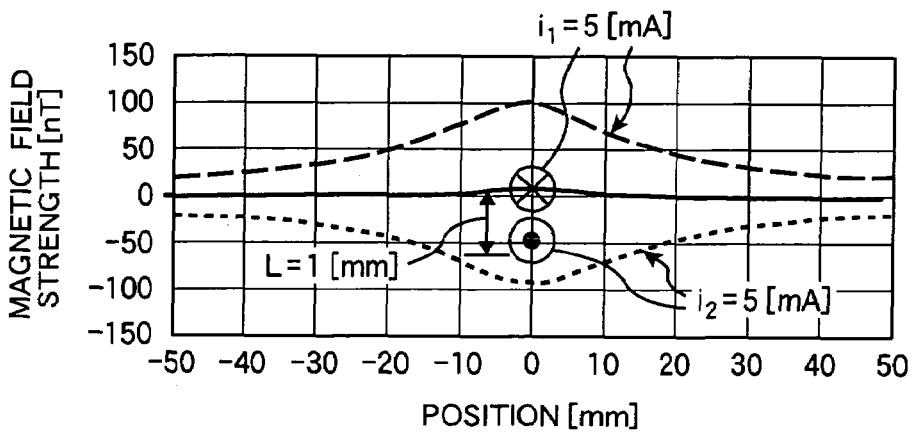

FIG. 4(b) is a graph indicating magnetic field strengths induced at a position with a distance h (=10 mm) in a vertical direction from a coil (heater wires), under the condition that two conductors are located with the arrangement of the upper and lower sides with a distance of L (=2 mm) to each other, and currents of $i_1$ (=5 mA) and $i_2$ (=5 mA) flow through the respective conductors in mutually opposite directions. In this case, the magnetic fields induced by the upper and lower conductors are canceled out, and the variation ΔB of the resultant magnetic field is 9 nTpp. The magnetic field strength varies upward with respect to a reference line associated with a zero level. The variation is smaller than it is when the two conductors are lined side by side.

Figure 4C:
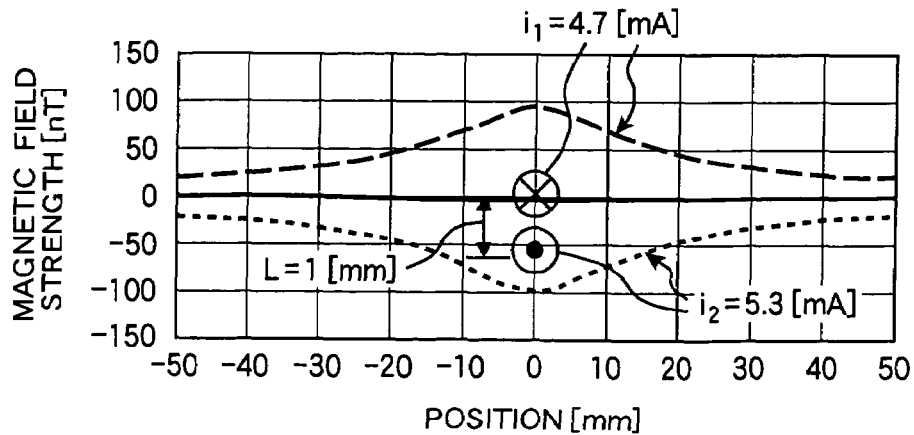

Next, in FIG. 4(c), the arrangement of two conductors is the same as that of FIG. 4(b), but the amount of currents flowing respective conductors. Namely, although the sum of the currents flowing through the two conductors is held the same as the case of FIG. 4(b), the current flowing through the lower conductor is made larger than that flowing through the upper conductor in the same manner as the currents $i_1$ (=4.7 mA) and $i_2$ (=5.3 mA) shown in FIG. 4(c). In this case, the variation ΔB of the resultant magnetic field decreases to be 2.6 nTpp. The variation of the magnetic field strength is not graphically indicated because the magnetic field strength is plotted as a line substantially superimposed on the reference line associated with the zero level.

As mentioned above, when opposite currents flow through two conductors, that is, two heater wires, magnetic fields are canceled out. The adverse effect of the resultant magnetic field is limited. When the two conductors are layered with the arrangement of the upper and lower side, the variation ΔB of one of magnetic field strengths representing the resultant magnetic field is smaller than when the two conductors are lined side by side. Consequently, high-resolution lithography is improved.

Preferably, two mutually identical wires are layered, and currents oriented in opposite directions are fed to the wires. More preferably, the each of the wires is turned repeatability and densely so that the pitch between adjoining turned portion of each wire will be minimized.

Table 1 lists estimates of magnetic field strengths induced around a heater at the position of a sample, that is, the results of analysis.

thereof is opposite to the direction of current flowing through the upper heater wire, magnetic fields induced by the upper and lower heater wires are canceled out. The variations ΔBx, ΔBy, and ΔBz of the magnetic field strengths representing the resultant magnetic field are 5.3 [nT]pp, 5.3 [nT]pp, and 9.1 [nT]pp respectively. Furthermore, under condition 3, that is, in the case where the ratio of the current flowing through the upper heater wire to the current flowing through the lower heater wire is changed on condition that those currents is in mutually directions, the variations of the magnetic field strengths can be further reduced.

The above numerical analysis is executed by assuming at the position of a sample having a distance 10 mm from the upper heater wire. Furthermore, if the position of the sample has a distance equal to or larger than 10 mm from the upper heater wire, the resultant magnetic field is further attenuated. The current value of 5 mA is a maximum value attained with temperature controlled. In a steady state, a current of 1 mA or less flows.

In order to generate heat by a quantity of 2.5 W using a small current of about 5 mA, an applied voltage must be equal to or higher than 500 V and a heating resistance must be equal to or larger than 100 kΩ. However, a nonmagnetic material is suitable for the material of a heating resistor. A nonmagnetic and conductive metal such as aluminum or titan is selected as the material of the resistor, and the cross-sectional area of the resistor is reduced in order to increase the resistance. Moreover, each heater wire is processed to have equidistant turns, and the pitch L between adjoining ones of turned heater wire potions is set to 2 mm or less.

TABLE 1

Estimates of magnetic field strengths around a heater at the position of a sample (Results of analysis)

| Conditions | Heater structure | Current flowing through an upper heater wire [mA] | Current flowing through a lower heater wire [mA] | Ratio of the current through the current lower heater wire to the flowing through the upper heater wire (a sign indicates the direction of the current) | ΔBx [nT]pp | ΔBy [nT]pp | ΔBz [nT]pp |
|---|---|---|---|---|---|---|---|
| 1 | One-layer | 5 | 0 | 0 | 49 | 49 | 73 |
| 2 | Two-layer | 5 | 5 | −1 | 5.3 | 5.3 | 9.1 |
| 3 | Two-layer | 4.7 | 5.3 | −1.12 | 2.8 | 2.8 | 3.8 |

By taking for instance a heater that the heat range is 150 mm wide and 150 mm long, and a wiring pitch between adjoining turned wire potions is L (=2 mm), simulation is performed in order to estimate a magnetic field induced at the position of a sample under the conditions that a current i (=5 mA) flows through the heater and the sample has a distance h (=10 mm) from the heater.

Table 1 lists the results of analysis. In the case where the current of 5 mA is fed to the upper heater wire alone (condition 1), the variation ΔBx of a magnetic field strength in an X direction is 49 [nT]pp, the variation ΔBy of a magnetic field strength in a Y direction is 49 [nt]pp, and the variation ΔBx of a magnetic field strength in a Z direction is 73 [nT]pp. In the case where the current of 5 mA is also fed to the lower heater wire (condition 2) so that the direction The heater is incorporated in the stage or electrostatic chuck, and a current feed line is connected to a power supply. Lithography is then performed while currents flowing through the heater wires are controlled so that the temperature at the position of a sample will be maintained at a constant.

Figure 1:
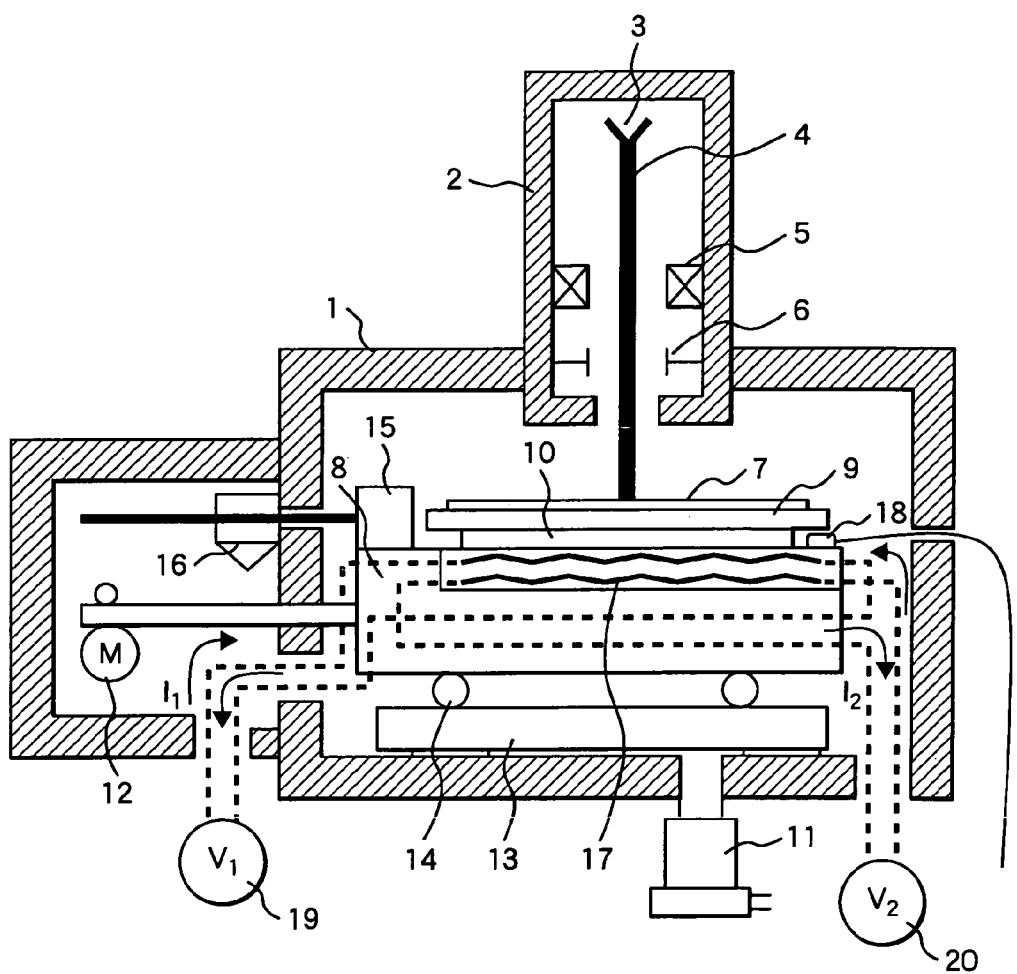
FIG. 1 is a cross section showing schematically the configuration of the electron-beam lithography system in accordance with an embodiment of the present invention.

Next, an embodiment of the present invention will be described in conjunction with FIG. 1.

Electron-beam lithography system comprises mainly a sample chamber 1 and an electro-optical column 2.

In the electro-optical column 2, an electron beam 4 radiated from an electron gun 3 is focused at an electromagnetic lens 5, and deflected by a deflector 6.

A stage 8 for moving a sample 7 is placed in the sample chamber 1. The stage 8 can move on an X-Y plane.

A sample holder 9 is secured on the stage 8 owing to an electrostatic force set up by an electrostatic chuck 10, and the sample 7 is held with the sample holder 9.

The interior of the sample chamber 1 is deaerated by a vacuum pump 11 and maintained at a vacuum all the time.

In electron-beam lithography, the position of a spot is inched by deflecting the electron beam 4, and the sample 7 is moved on the stage 8. Consequently, a circuit pattern of a device is drawn all over the sample 7.

During lithography, there are a heat from a drive-motor 12 for the stage 8, a frictional heat dissipated when rollers 14 roll on a stage guide 13, and a heat from the electrostatic chuck 10. The quantities of heat dissipated from the motor 12 and stage guide 13 respectively depend on the operation time of the stage 8. The quantity of heat dissipated from the electrostatic chuck 10 depends on the chucking time during which the sample holder 9 is chucked. The quantities of heat vary depending on a lithography pattern or a lithography time, and vary time-sequentially.

Moreover, when a temperature at a room where the system is installed varies, a temperature of the structural member of the system varies. The position of the sample 7 is detected by measuring the distance between a bar mirror 15 on the stage 8 and an interferometer 16 using a laser. If the sample 7 or the structural member of the stage 8 expands and contracts, a lithography pattern cannot be drawn at a predetermined position on the sample 7. As a result, Pattern positioning precision is degraded.

Figure 5:
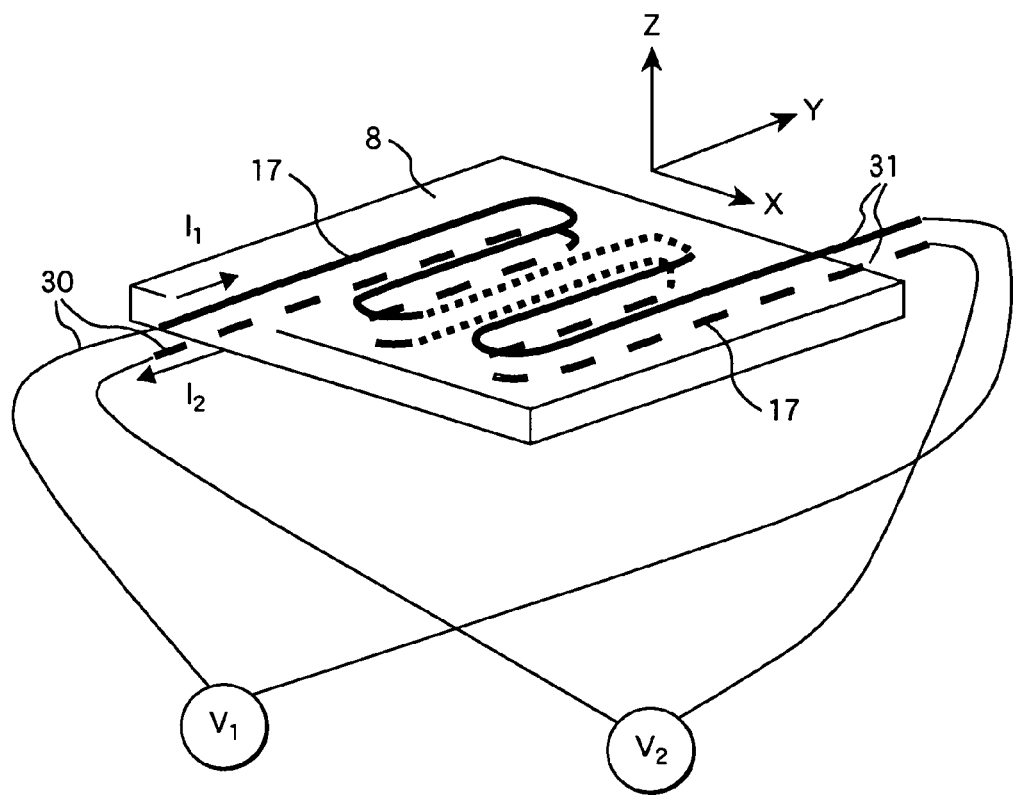
FIG. 5 is a perspective showing a location of the heater wires.

Next, an embodiment shown in FIG. 2 and FIG. 5 will be described below.

Figure 2:
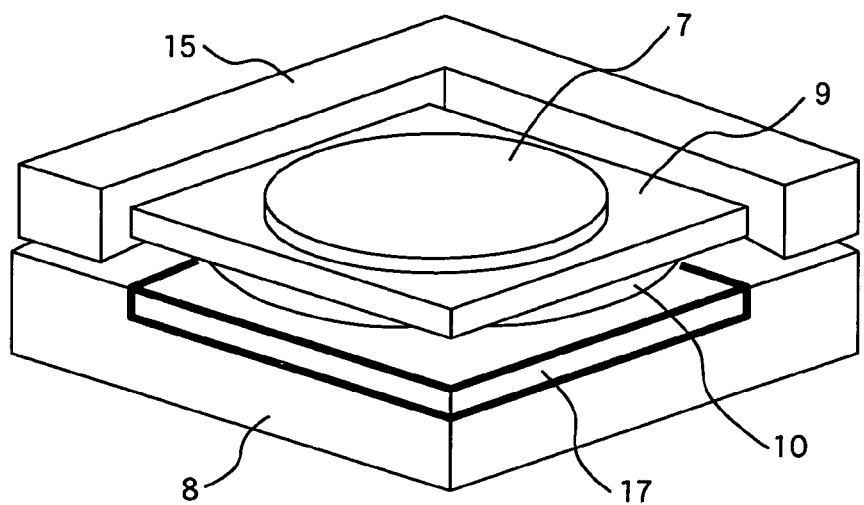
FIG. 2 is a perspective showing the arrangement of heater wires included in the embodiment of the present invention.

FIG. 2 shows the arrangement of heater wires. FIG. 5 is an explanatory diagram illustratively showing the structure thereof.

Heater wires 17 are incorporated at a position near the sample 7 in the structural member of the stage. A temperature sensor 18 is used to sense the temperature at the position of the sample 7. Temperature controllers 19 and 20 are used to control currents flowing through the heater wires 17, whereby the quantities of heat are kept constant in order to minimize a variation in the temperature.

In order to continue lithography even during the passage of currents through the heater wires, a magnetic field induced by the heater wires 17 must be reduced. Therefore, resistances offered by the heater wires 17 are increased, and currents for heater wires are decreased. Furthermore, in order to reduce the magnetic field induced by the heater wires, the heater wires are shaped according to the same pattern, and as shown in FIG. 5, are incorporated with the arrangement of the upper and lower sides by two-layer structure, and the directions of currents flowing through the upper heater wire and the lower heater wire are opposite to each other, and the current flowing through the lower heater wire is made slightly larger than that of the higher heater. Consequently, the magnetic field strength is reduced to be reaching order of 3 nT. As illustratively shown in FIG. 5, the pitch between the turned heater wire potions is set to 2 mm and a plane laying each heater wire is set to a size of 201 mm by 200 mm. In this case, each of the heater wires has 100.5 turns. Preferably, the turned portions of each of the heater wires are juxtaposed densely, that is, the pitch between adjoining ones of the turned portions is small.

Moreover, the pair of turned heater wires 17 is laid down on the stage 8 in a rectangular form. The current feed terminals 30 of the heater wires 17 and the current feed terminals 31 thereof are located diagonally to each other in the rectangular form.

The ratio of the current flowing through the upper heater wire to the current flowing through the lower heater wire is determined with the distance between the upper and lower heater wires or the distance from the heater wires to a sample. For controlling the temperatures of the heater wires, PID control, namely proportional, integral, and differential control may be employed.

Next, an embodiment shown in FIG. 6 and FIG. 7 will be described below.

Figure 6:
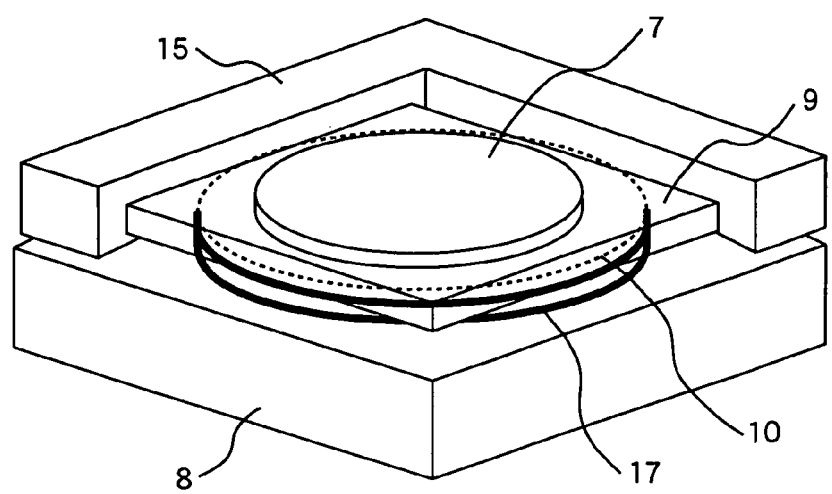
FIG. 6 is a perspective showing the arrangement of heater wires in the stage.

FIG. 6 shows an electrostatic chuck 10 to which heater wires 17 are bonded to suppress a variation of a quantity of heat dissipated from the electrostatic chuck 10. FIG. 7 shows currents flowing through the heater wires 17 shaped according to the same pattern.

Figure 7:
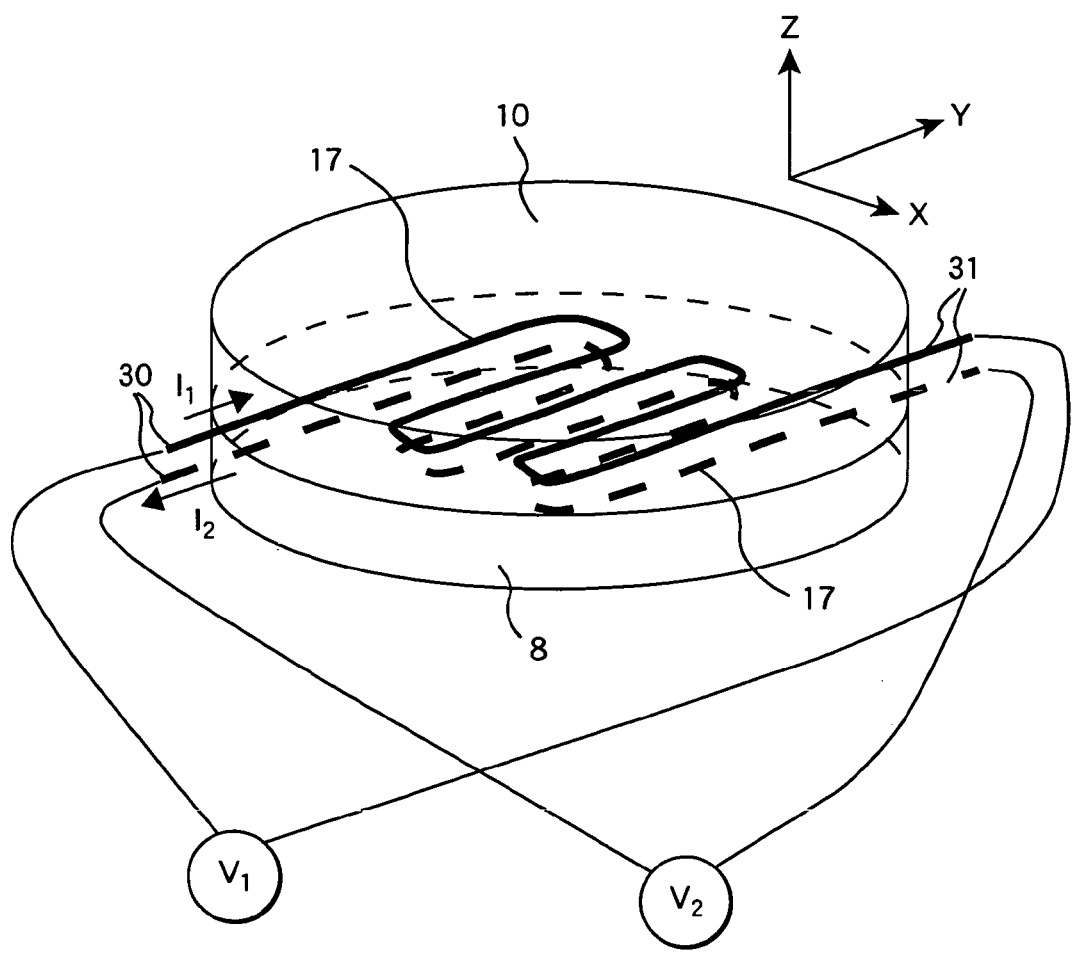
FIG. 7 is a perspective showing the arrangement of heater wires in a sample holder.
Figure 8:
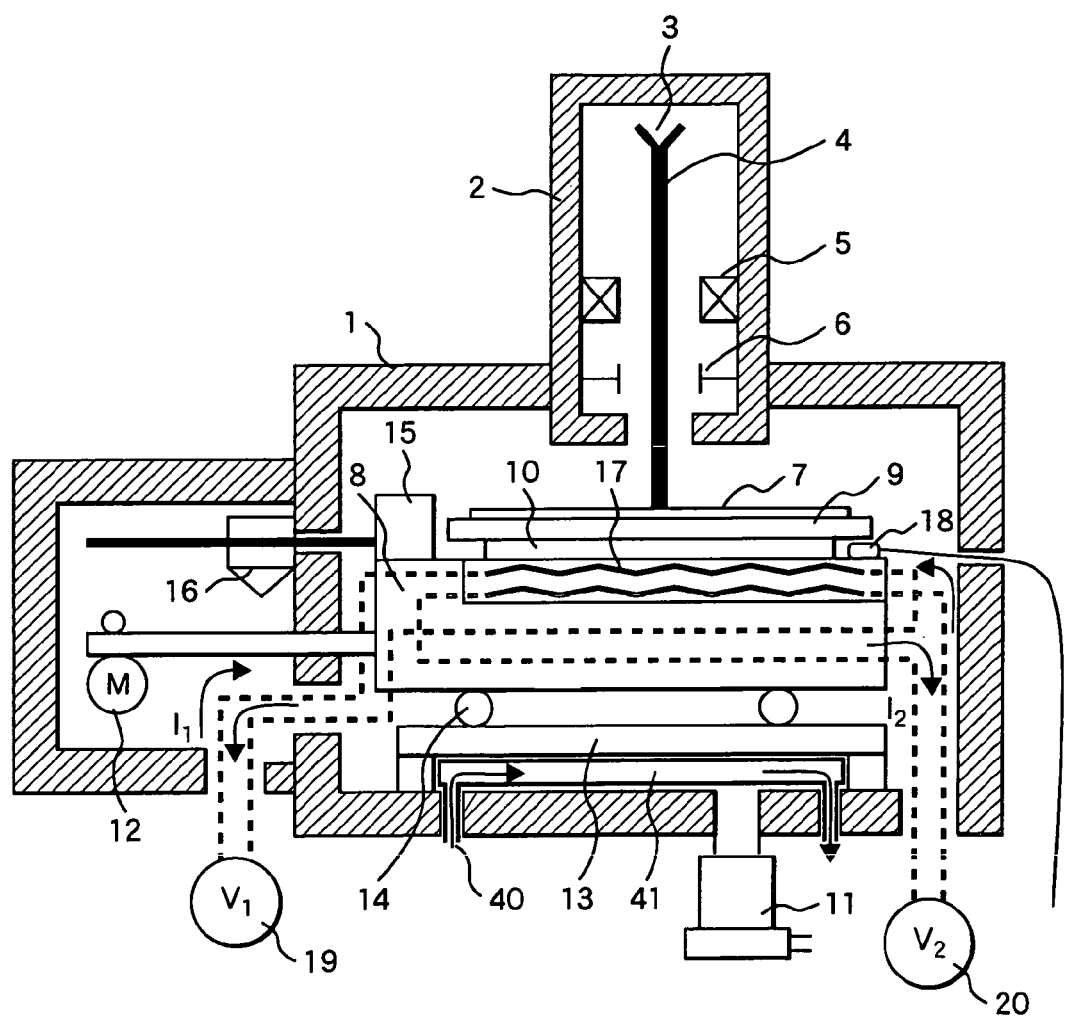
FIG. 8 is a cross section showing schematically the configuration of the electron-beam lithography system.
Figure 9:
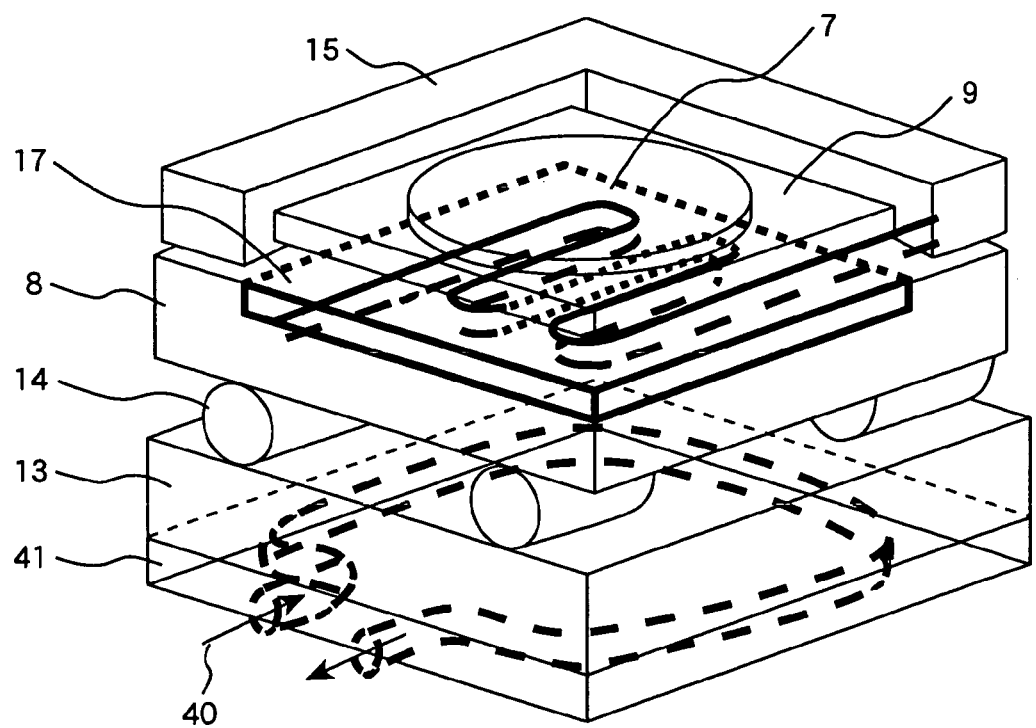
FIG. 9 is a perspective showing the arrangement the heater wires from the stage to a cooling plate.

As shown in FIG. 7, the heater wires shaped according to the same pattern are layered with the arrangement of the upper and lower sides, and the directions of currents flowing through the respective heater wires are opposite to each other.

The current flowing through the lower heater wire is made slightly larger than that of the upper heater, whereby a magnetic field strength induced at the position of a sample can be reduced even during the passage of currents through the heater wires. Eventually, high-resolution lithography can be achieved.

As mentioned above, by controlling the temperature of heater wires of the upper and lower sides, the temperatures of the sample and the structural member of the stage can be stabilized, and the thermal distortions of the sample and member can be prevented. Eventually, high-precision lithography can be achieved even during the operation of heater wires.

Next an embodiment shown in FIG. 6 and FIG. 7 will be described below.

The interior of the sample room is affected by a heat from the vacuum pump 11, a frictional heat from a stage guide 13, a radiant heat from electromagnetic lens 5, and heat dissipated during the electron-beam radiation to the sample. As a result, a temperature of the stage in the interior of the sample room tends to be higher than an environment at the installment of the system. The temperature of the stage is needed to make matching with the temperature of the sample. In this embodiment, the system has a cooling plate (cooling device) 41 for circulating a coolant in a stationary structural member of the stage. For example, the cooling plate 41 is installed on the underside of the stage guide 13. The heat at the stage is absorbed to the circulated coolant (water, refrigerant etc.) and is dissipated to outside of the sample chamber 1. Since temperature control resolution of the cooling device is $1/100 \sim 5/100°$ C., the heater 17 and temperature sensor 18 are required high-resolution temperature control. Consequently, after loading the sample on the stage, the lithography can start in a short time, the system throughput can be improved.

What is claimed is:

1. An electron-beam lithography system for drawing a desired pattern on a sample with an electron beam, comprising:

a pair of heater wires incorporated in a sample holding stage with an arrangement of the upper and lower sides;

a temperature sensor for sensing a temperature of the sample or stage; and a temperature controller for controlling the passage of current through the heater wires according to a value sensed with the temperature sensor, wherein the directions of respective currents flowing through the upper heater wire and the lower heater wire are opposite to each other.

2. The electron-beam lithography system according to claim 1, wherein both the upper and lower heater wires have respectively resistances of 100 kΩ or more.

3. The electron-beam lithography system according to claim 1, wherein the current flowing through the lower heater wire is larger than that of the upper heater wire.

4. The electron-beam lithography system according to claim 1, wherein each of the heater wires has turns of which a pitch between adjoining ones of the turned portions is 2 mm or less, and the top face of the upper heater wire is located at a distance of 2 mm or more from the surface of the sample.

5. The electron-beam lithography system according to claim 1, wherein each of the heater wires has turns with a desired pitch between adjoining ones of the turned portions and is laid in a rectangular form, and current feeding-terminals of the heater wires are located at diagonal positions in the rectangular form.

6. The electron-beam lithography system according to claim 1, wherein the stage includes an electrostatic chuck for attracting a sample holder with an electrostatic force to hold the sample.

7. The electron-beam lithography system according to claim 1, wherein the system has a cooling plate for circulating a coolant in a stationary structural member of the stage.

8. An Electron-beam lithography method for drawing a desired pattern on a sample with an electron beam, comprising:

on the condition that a pair of heater wires incorporated in a sample holding stage with an arrangement of the upper and lower sides, flowing respective currents through the upper heater wire and the lower heater wire in mutually opposite directions;

controlling the currents flowing through the heater wires with a temperature controller so that a value sensed with the temperature sensor for measuring the temperature of the sample or stage is maintained in a designated temperature.

* * * * *